(12) United States Patent
Van Beylen

(10) Patent No.: US 6,437,648 B1
(45) Date of Patent: Aug. 20, 2002

(54) AUDIO AMPLIFIER WITH TRANSFORMERLESS POWER SUPPLY

(76) Inventor: William Van Beylen, 1990 Low Wood Trail, Leonard, MI (US) 48376

(*) Notice: Subject to any disclaimer, the term of this patent is extended or adjusted under 35 U.S.C. 154(b) by 43 days.

(21) Appl. No.: 09/653,400

(22) Filed: Sep. 1, 2000

(51) Int. Cl.⁷ ............................................. H03F 3/04
(52) U.S. Cl. ............................................... 330/297
(58) Field of Search .......................... 330/59, 127, 297; 363/44; 381/120

(56) References Cited

U.S. PATENT DOCUMENTS

| | | | |
|---|---|---|---|
| 3,859,604 A | * 1/1975 | Rankin | 330/297 X |
| 3,944,944 A | 3/1976 | Ellenbecker | 330/149 |
| 4,035,669 A | 7/1977 | Yokoyama | 307/293 |
| 4,374,363 A | 2/1983 | Previti | 330/263 |
| 4,555,672 A | 11/1985 | Segal | 330/255 |
| 4,668,921 A | 5/1987 | Tamura | 330/297 |
| 4,713,629 A | 12/1987 | Segal | 330/263 |
| 4,741,039 A | 4/1988 | Bloy | 381/98 |
| 4,809,336 A | 2/1989 | Pritchard | 381/61 |
| 4,995,084 A | 2/1991 | Pritchard | 379/94 |
| 5,161,198 A | 11/1992 | Noble | 381/81 |
| 5,424,683 A | 6/1995 | Takahashi | 330/255 |
| 5,498,997 A | 3/1996 | Schiebold | 330/277 |
| 5,499,154 A | 3/1996 | Cullison | 361/18 |
| 5,604,461 A | 2/1997 | Rozenblit | 330/81 |
| 5,612,646 A | 3/1997 | Berning | 330/10 |
| 5,675,426 A | 10/1997 | Meisner et al. | 358/838 |
| 5,805,713 A | 9/1998 | Pritchard | 381/61 |
| 5,834,977 A | 11/1998 | Maehara et al. | 330/297 |
| 5,886,506 A | 3/1999 | Ozawa | 323/222 |
| 6,005,642 A | 12/1999 | Meisner et al. | 348/838 |

* cited by examiner

*Primary Examiner*—Steven J. Mottola
(74) *Attorney, Agent, or Firm*—Gifford, Krass, Groh, Sprinkle, Anderson & Citkowski, P.C.

(57) ABSTRACT

In a high-fidelity, high-power audio amplifier, the power supply makes direct connection is made to the AC line, followed by appropriate rectification and filtering, but without the need for a power transformer. The invention is not limited in terms of the class of amplifier, and may be applied at least to class A and class AB configurations. The input is AC-coupled without the use of a ground potential, preferably using capacitive coupling. To provide voltage levels appropriate for referencing and other purposes, a pseudo-ground is established, preferably through the use of a resistive ladder across the rectified line. The use of this divider network not only provides DC voltages to operate integrated components such as operational amplifiers, but also serves to provide reference signals for differential amplifiers in the output stages.

10 Claims, 2 Drawing Sheets

AUDIO AMPLIFIER WITH TRANSFORMERLESS POWER SUPPLY

FIELD OF THE INVENTION

This invention relates generally to audio amplifiers and, more particularly, to audio amplifier configurations that may be connected to the AC line without the need for a power transformer.

BACKGROUND OF THE INVENTION

Audio amplifiers operate by increasing the power of signals in the audible frequency range prior to delivery to an appropriate acoustic transducer (speaker). Both analog and digital designs exist, but in all cases, stable DC voltage levels are required for biasing, to provide reference levels, and so forth.

Unless the amplifier is battery operated, desirable DC voltages must be derived from some type of power supply connected to the AC line. Traditional power supplies incorporate a power transformer having a primary winding connected to the AC line, and a secondary winding connected to rectifiers and capacitor filters to smooth out the DC levels once established.

Switch-mode power supplies are also available, wherein an input signal is typically converted to a high-frequency signal prior to voltage transformation, thereby facilitating the use of a smaller transformer. In all cases, however, a transformer must be provided. To provide positive and negative voltages with respect to ground, a secondary winding having a center tap is generally employed.

Power supply transformers are large, heavy, and relatively expensive. They are heavy because the core material is generally ferrous, and they are expensive because the winding procedure generally cannot be entirely automated. Although switch-mode power supplies are able to utilize smaller transformers, the peripheral components are expensive, and the design may not be suitable for high-fidelity audio amplification to the extent that high-frequency signals and harmonics must be avoided.

SUMMARY OF THE INVENTION

This invention improves upon the existing art of audio amplifier design by providing a high-fidelity, high-power audio amplifier that forgoes the need for a power supply transformer. That is, owing to the inventive design of this amplifier, direct connection may be made to the AC line, followed by appropriate rectification and filtering, but without the need for a power transformer. The invention is not limited in terms of the class of amplifier, and may be applied at least to class A and class AB configurations.

In the preferred embodiment, the inventive amplifier utilizes a full-wave bridge rectifier connected directly to the AC line. Following rectification, a preferably large amount of capacitance is used to provide sufficient filtering and energy storage to supply peak power output requirements.

The inventive amplifier is according used in a bridged configuration, so that neither speaker terminal is exposed to ground potential. Since a transformer is not used on the power supply, the typical center tap is also unavailable, thereby eliminating a convenient ground reference. To ensure that the amplifier floats relative to input-signal sources, the input is coupled without the use of a ground potential. Although magnetic or optical input coupling means may be used, capacitive coupling of the input is utilized in the preferred embodiment.

To provide voltage levels appropriate for referencing and other purposes in the amplifier, a pseudo-ground is established, preferably through the use of a resistive ladder across the rectified line. The use of this divider network not only provides DC voltages to operate integrated components such as operational amplifiers, but also serves to provide reference signals for differential amplifiers in the output stages.

DETAILED DESCRIPTION OF THE INVENTION

Figure 1:
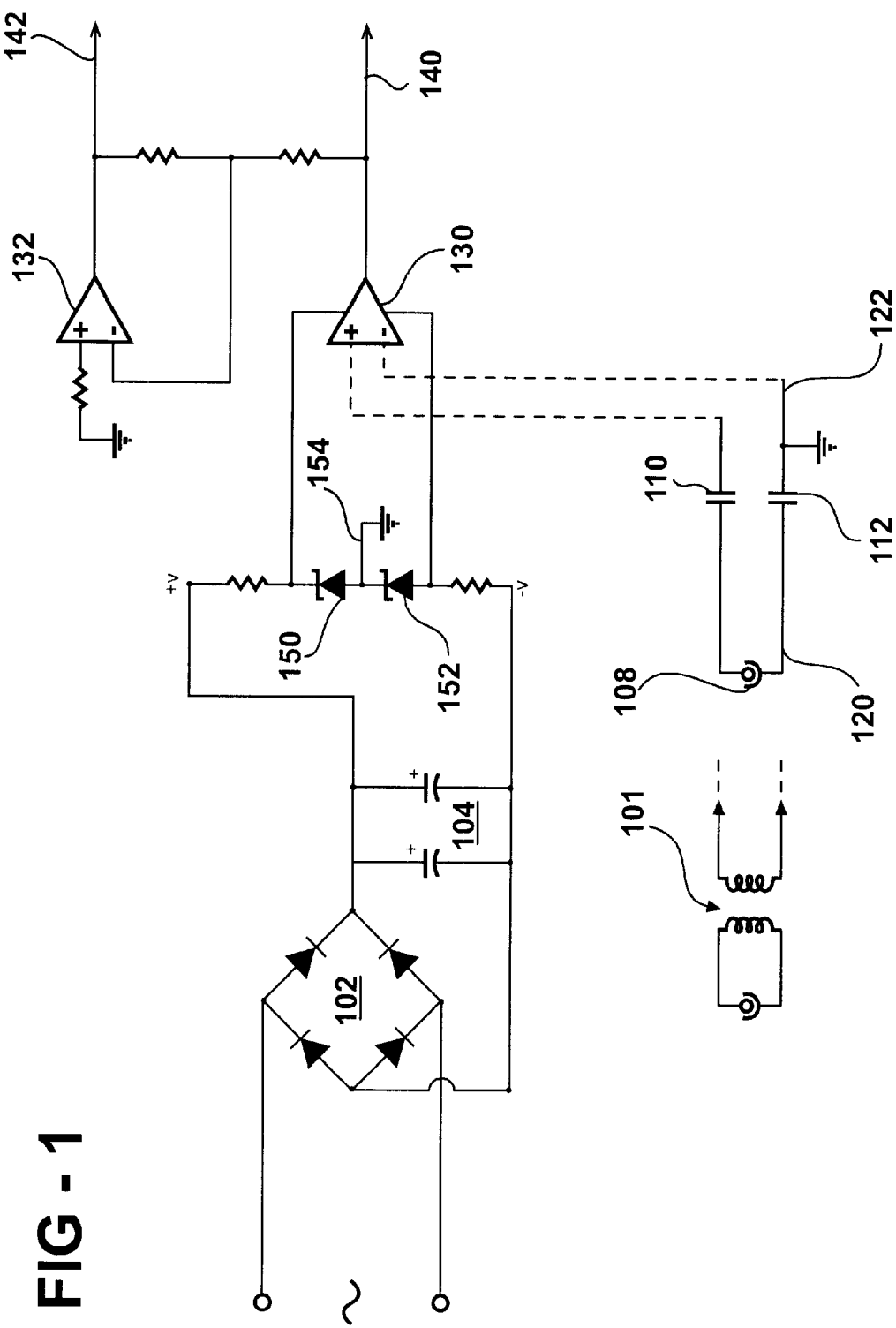
FIG. 1 is a simplified block diagram of an audio amplifier according to the invention which does not require a power supply transformer.

FIG. 1 is a simplified block diagram used to introduce important concepts according to the invention. The AC line is presented to a full-wave bridge rectifier 102 which, in turn, feeds a bank of capacitors 104 providing a DC voltage. In the preferred embodiment, a plurality of high-capacity devices rated at 200 volts are used, such as 3900 microfarad electrolytic units.

A signal to be amplified is AC-coupled to input 108; that is, without a DC component. Although an opto-isolator or small-signal transformer 101 may be used for this purpose, in the preferred embodiment, capacitive coupling is used for low-cost with sufficient fidelity. A medium-sized capacitance 110 is used on the signal input terminal, whereas a relatively large capacitance 112 is used on the "ground" side of the input 120. Both capacitances are non-polarized, since it is unclear how the input source will be referenced to its own ground. The use of a large capacitor on the "ground" side of the input connector allows the path 122 to AC couple the input signal ground to the amplifiers "floating ground" even though both grounds are at different DC potentials.

Without the use of appropriate input coupling according to the invention, the signal on path 120 would, of course, assume the same potential present on the ground side of the input signal. Since, however, a pseudo-ground is created within the inventive amplifier for the purpose of generating reference signals, and so forth, this actual ground on path 122 would tend to be different from the pseudo-ground as described below, causing the input signal to be non-symmetrical with respect to the power amplifier stages. As such, positive excursions may be clipped, or clipped differently, than negative excursions, or vice-versa, without appropriate coupling. In order to achieve symmetrical clipping, the amplifier ground 122 is set to the midpoint voltage between V+ and V−.

The input signal is fed to a low-power amplifier stage using op amps 130 and 132 to route inverted signals on paths 140 and 142 as required for a bridged output stage (not shown). To create the DC voltages required to power the operational amplifier, a resistive divider is preferably used along with zener diodes 150 and 152 to develop positive and negative voltages relative to a pseudo-ground 154. The pseudo-ground 154 is used as a reference by the power amplifier stages. In particular, the pseudo-ground is used as a reference for the differential amplifiers, current sources, and so forth in the power stages, as will now be described with reference to FIG. 2.

Figure 2:
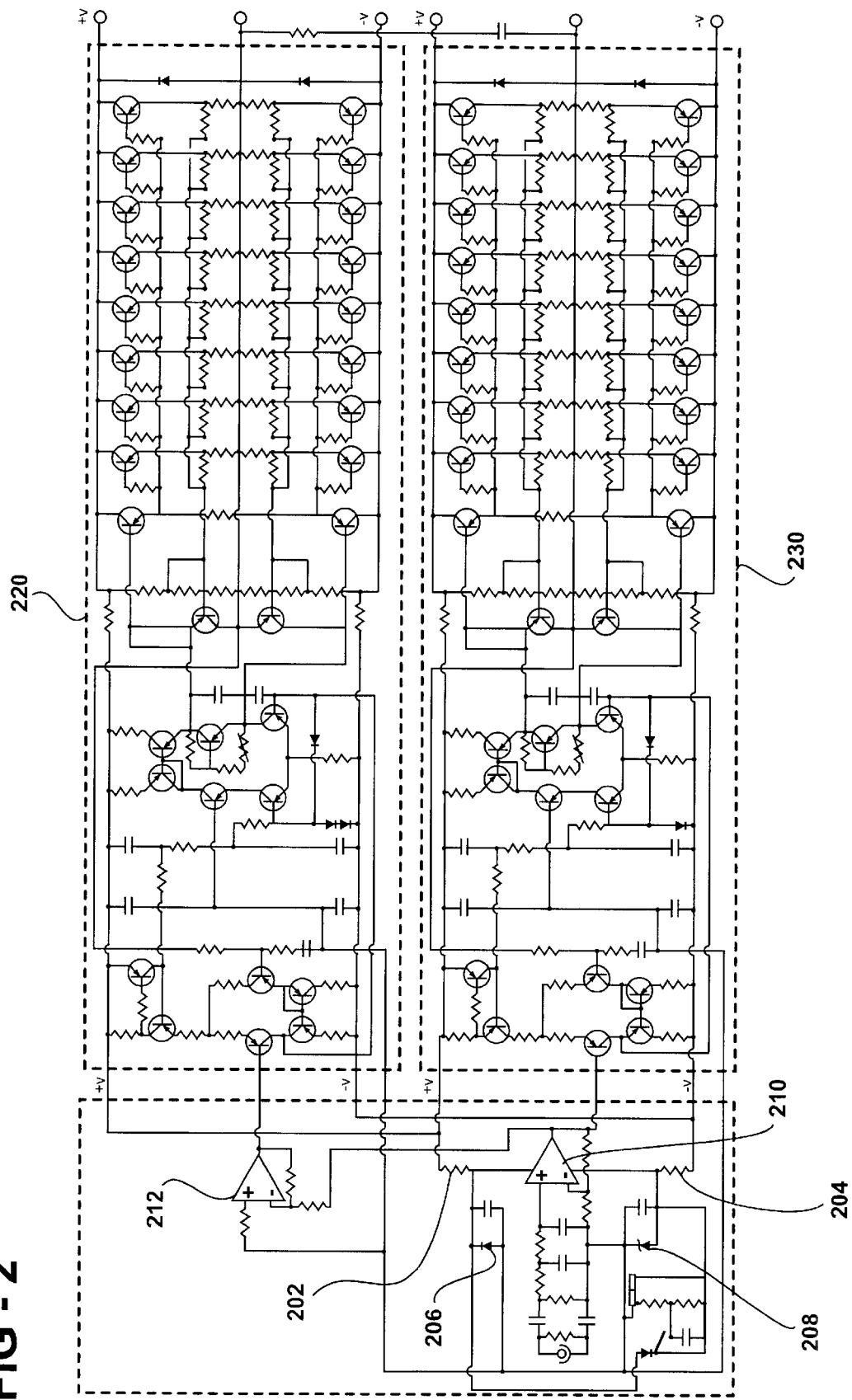
FIG. 2 is a detailed schematic diagram of a preferred embodiment of the invention.

FIG. 2 is a detailed schematic diagram illustrating a preferred embodiment of the invention. The input signal is delivered to a typical phone-style connector, with the signal carrying side being coupled to the input board using a 22 microfarad capacitor, and the ground side of the input signal being coupled using a 2200 microfarad capacitor. The voltage divider utilizes 3K, 5 W resistors 202 and 204 to establish a pseudo-ground potential on path G. Zener diodes 206 and 208 provide appropriate positive and negative voltages to the operational amplifiers 210 and 212. The combination of OP amps 210 and 212 provide mirror-image versions of the input signal for delivery to the power amplifier boards 220 and 230 configured in a bridged arrangement.

The power amplifiers are typical class AB amplifiers incorporating an input differential amplifier, followed by a cascode voltage amplifier stage and push-pull current amplifier. The final output stage preferably uses a plurality of power transistors in parallel to share the current. Although the biasing of the transistors shows a class AB operation, it will be apparent to one of skill in the art that through appropriate adjustment of the biasing, class A operation is readily achievable. The power transistors are mounted on heat sinks, as required, with active cooling preferably being used so that temperature limits are not exceeded.

In operation, given the use of full line voltage, the amplifier just described delivers 1200 watts into an 8 ohm load, and over 2000 watts into a 4 ohm load. Since amplifiers with such a power rating typically require a bank of filter capacitors from the power supply to deliver to necessary energy to fulfill transient requirements, and use multiple power transistors in parallel to share current on a common heat sink, the present invention offers all of the advantages of previous designs, but eliminates the need for a transformer associated with the power supply, assuming the use of appropriate input coupling and DC voltage generation, as discussed herein.

I claim:

1. An audio amplifier, comprising:
   a) an input stage providing complementary outputs to a bridged output stage; and
   b) an audio input including one or more components used to AC couple an input signal to the input stage for amplification by the output stage; and
   c) a power supply connected to the AC line without a transformer, the power supply including:
   a rectifier and filter capacitors providing a high DC voltage,
   a voltage divider connected across the high DC voltage, the divider including a center point establishing a pseudo-ground, and
   components operative to generate low positive and negative DC voltages relative to the pseudo-ground for use by the input and output stages.

2. The audio amplifier of claim 1, wherein the components operative to generate low positive and negative DC voltages relative to the pseudo-ground include a resistive ladder.

3. The audio amplifier of claim 1, wherein the components operative to generate low positive and negative DC voltages relative to the pseudo-ground include a pair of zener diodes.

4. The audio amplifier of claim 1, wherein the components used to AC couple the input signal to the input stage for amplification by the output stage include a pair of capacitors.

5. The audio amplifier of claim 1, wherein the components used to AC couple the input signal to the input stage for amplification by the output stage include an opto-isolator.

6. The audio amplifier of claim 1, wherein the components used to AC couple the input signal to the input stage for amplification by the output stage include a low-power signal transformer.

7. The audio amplifier of claim 1, wherein the output stage is operated in class A or AB.

8. A power supply for an audio amplifier having an input signal which is AC coupled to an input stage and a bridged output stage, the power supply comprising:
   a rectifier connected across the AC line without a transformer and filter capacitors providing a high DC voltage;
   a voltage divider connected across the high DC voltage, the divider including a center point establishing a pseudo-ground, and
   components operative to generate low positive and negative DC voltages relative to the pseudo-ground for use by the input and output stages.

9. The power supply of claim 8, wherein the components operative to generate low positive and negative DC voltages relative to the pseudo-ground include a resistive ladder.

10. The power supply of claim 8, wherein the components operative to generate low positive and negative DC voltages relative to the pseudo-ground include a pair of zener diodes.

* * * * *